United States Patent [19]

Nelson et al.

[11] Patent Number: 4,467,611
[45] Date of Patent: Aug. 28, 1984

[54] THERMOELECTRIC POWER GENERATING DEVICE

[75] Inventors: John L. Nelson; Robert L. Montgomery, both of Garland; Richard J. Buist, Richardson, all of Tex.

[73] Assignee: Marlow Industries, Inc., Dallas, Tex.

[21] Appl. No.: 432,783

[22] Filed: Dec. 13, 1982

[51] Int. Cl.³ ............................................. F25B 21/02
[52] U.S. Cl. ......................................................... 62/3
[58] Field of Search ....................... 62/3; 136/203, 204

[56] References Cited

U.S. PATENT DOCUMENTS

| | | | |
|---|---|---|---|
| 3,084,267 | 4/1963 | Newell | 62/3 X |
| 3,131,545 | 5/1964 | Gross et al. | 62/3 |
| 3,316,474 | 4/1967 | Lode | 62/3 X |
| 3,386,255 | 6/1968 | Venema | 62/3 |
| 3,478,230 | 11/1969 | Otter, Jr. et al. | 62/3 X |
| 3,733,836 | 5/1973 | Corini | 62/3 |
| 4,066,365 | 1/1978 | Staunton | 62/3 X |

Primary Examiner—Lloyd L. King
Attorney, Agent, or Firm—Alva H. Bandy

[57] ABSTRACT

Alternating current is applied to a bi-directional triode thyristor (triac) and a zero voltage switch, the zero voltage switch controls the operation of the triac to selectively heat a heater element, the thermal energy of the heater element drives a first thermoelectric heat pump (module), acting as a dc power generator, to produce power to drive a second thermoelectric heat pump acting as a cooling or heating source, towards a preselected temperature, a thermally sensitive resistor (thermistor) senses the temperature and generates a resistance corresponding to the temperature, the thermistor is connected to the zero voltage switch in series with a temperature set point resistor (potentiometer) and source of power to form a voltage divider input to the zero voltage switch, whereby when the resistance of the thermistor substantially equals that of the temperature set point resistor the zero voltage switch inhibits the trigger pulses to the triac to cut off ac current to the heater element.

7 Claims, 2 Drawing Figures

THERMOELECTRIC POWER GENERATING DEVICE

BACKGROUND AND SUMMARY

This invention relates to a thermoelectric power generating device and more particularly to a direct current power supply for a temperature controlled thermoelectric cooling or heating device.

Numerous electrical systems such as, for example, intrusion detectors include an infrared (IR) energy detector. Some IR detectors must be cooled for proper operation; while, others must be heated to preselected temperatures and maintained at these temperatures for the detectors to detect, for example, body heat radiating from an intruder. Thermoelectric coolers for these detectors require a direct current power source. To make these thermoelectric coolers economically available to the public, batteries have been used to power the coolers thereby eliminating the requirement for relatively expensive ac to dc convertors.

The present invention includes a transducer for converting thermal energy into electrical energy, such as, for example, a thermoelectric power generator. The thermoelectric generator generates a direct current (dc) for a thermoelectric heat pump. The thermoelectric heat pump is selectively connected to the thermoelectric power generator to provide the desired polarity for selectively cooling and heating, for example, an IR detector.

Another feature of the invention is to provide thermal energy for the thermoelectric power generator by means of an ac power supply. The ac power supply circuit includes a control circuit and a heater element for selectively supplying thermal energy to the thermoelectric heat pump.

Still another feature of the invention is to provide a temperature sensing network for sensing the temperature of a thermoelectric heat pump. The temperature sensing network includes a thermally sensitive resistor (thermistor) operable with a resistor of a temperature setting potentiometer to control the operation of a zero voltage control switch. Thus when the resistance of the thermistor substantially equals that of the temperature set point resistor the zero voltage control switch inhibits the trigger pulses to a triac to cut off ac power to a heater element.

Other features and advantages of the present invention will be apparent to persons skilled in the art of the following detailed description of a preferred embodiment when read in conjunction with the attached drawings.

THE DRAWINGS

DETAILED DESCRIPTION

Figure 1:
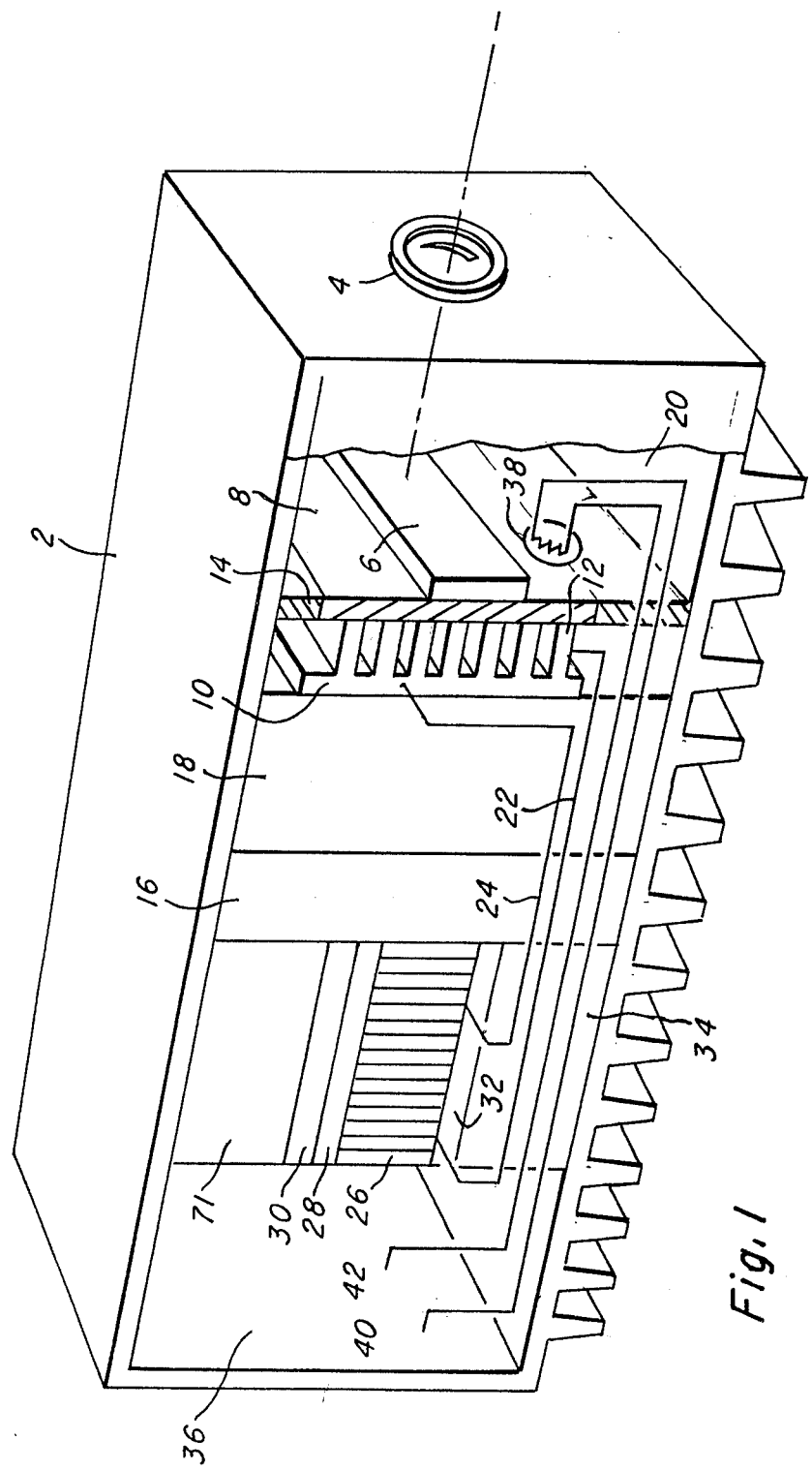
FIG. 1 is broken isometric view partly in section to show an embodiment of the invention.

Turning now to FIG. 1, a housing 2 has walls for a window 4. The housing 2 is a housing for shielding an infrared detector 6 from extraneous thermal energy. The window 4 is an infrared energy admitting window for channeling infrared energy emanating from a scene to the detector 6. The detector 6 may be, for example, a body of silicon, gallium arsenide, mercury cadmium telluride, or ferroelectric material such as, for example, lead sulfide, lead selinide, etc.

The detector 6 is attached, for example, by a suitable thermal transmitting epoxy to the surface of a first or working plate 8 of first and second plates 8 and 10 of a single or multi-stage thermoelectric heat pump 12. The thermoelectric heat pump 12 is mounted between partitions 14 and 16 of housing 2. The partition 14 separates the hot plate heat sink area 18 from the cold plate area 20. The partition 16 separates the hot plate heat sink area 18 from the thermoelectric generator 26 and heat sink area 34.

Lead wires 22 and 24 of the thermoelectric heat pump 12 are connected to the thermoelectric power generator 26 which may be, for example, a second thermoelectric heat pump for providing dc power of a polarity for heating and cooling, selectively, the first plate 8 of the first thermoelectric heat pump 12.

The thermoelectric power generator 26, hereinafter referred to as the second thermoelectric heat pump, has a first plate 28 connected to a heating element 30, and a second plate 32 connected to a heat sink 34. The heat sinks 18 and 34 are connected thermally to the housing 2. The heating element 30 is connected to a voltage controlled ac power supply 36, hereinafter described. A thermal insulator 71 is located between the heating element 30 and the housing 2. A negative temperature coefficient (NTC) thermistor 38 is positioned in housing 2 in operative association with the first plate 8 of thermoelectric heat pump 12 to sense the temperature of the first plate 8. The NTC thermistor 38 is operatively connected by leads 40 and 42 to the voltage controlled ac power supply 36 to control the operation of the heating element 30.

Figure 2:
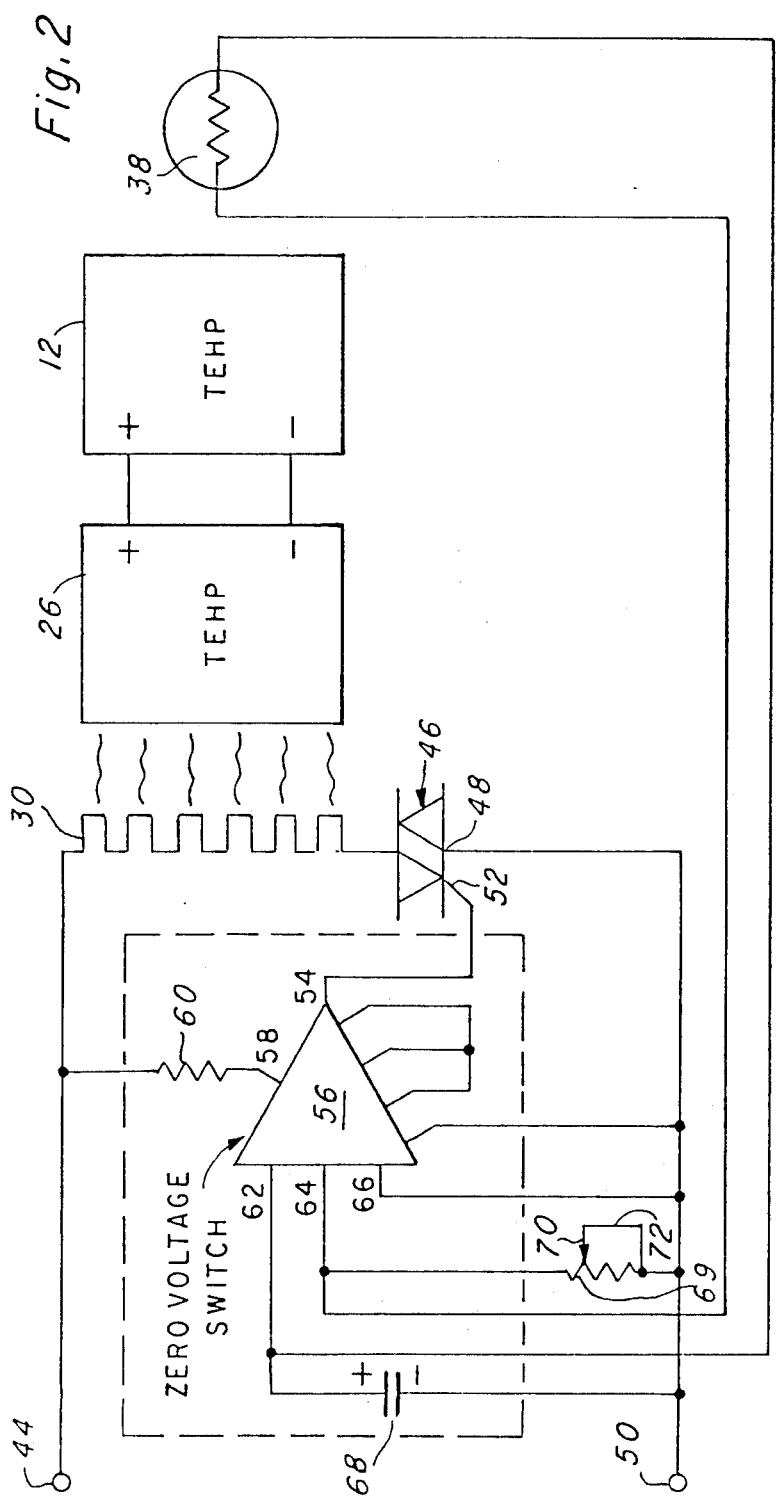
FIG. 2 is a diagrammatic view of the main circuit and parts of the present invention.

Referring now to FIG. 2 for a description of the temperature controlled ac power supply, the heating element 30 has one end connected to ac high terminal 44, and its other end connected to a bi-directional triode thyristor (triac) 46. Triac 46 may be, for example, a 2N5755 sold by Radio Corporation of America. The triac 46 has an input terminal 48 connected to ac low terminal 50 and a trigger terminal 52 connected to the output 54 of a zero voltage switch (ZVS) 56. The zero voltage switch 56 is, for example, a CA 3059 integrated circuit sold by Radio Corporation of America and includes a dc power source, a differential amplifier, and pulse gating circuitry.

The ZVS has terminal 58 connected through a voltage dropping resistor 60 to ac high terminal 44, its output terminal 54 connected to the trigger terminal 52 of triac 46, and its input terminals 62, 64 and 66 connected as follows:

Input terminal 62 is connected to the junction of the positive plate of filter capacitor 68 and to one side of the NTC thermistor 38. The negative plate of capacitor 68 is connected to the ac low terminal 50. Input terminal 64 is connected to the junction of one end of the resistor 69 of a potentiometer 70 and to the other side of NTC thermistor 38. The other end of the resistor 69 of the potentiometer 70 is connected to the ac low terminal 50. The arm 72 of potentiometer 70 is connected to a temperature setting dial, not shown. Input terminal 66 is connected to the ac low terminal 50.

In operation, ac power is applied to the heating element 30 (FIG. 2). Thermal energy generated by the heating element produces a temperature differential across the plates of the thermoelectric heat pump 26. This temperature difference causes the thermoelectric heat pump 26 to generate a dc voltage. The dc voltage is applied to the thermoelectric heat pump 12 which causes a dc current to flow therein and produce a temperature differential across it. Thus, a cold side and a hot side exists and is selectively determined by the polarity of the dc voltage. The NTC thermistor 38, being in thermal association with the first side of the thermoelectric heat pump 12, senses the temperature of the first plate of the thermoelectric heat pump 12. When the temperature is falling the resistance of thermistor 38 increases until the temperature reaches the point where the resistance of the NTC thermistor 38 corresponds substantially to the resistance of the temperature set point resistor 69 of the potentiometer 70. When the resistances are substantially equal, the ZVS 56 inhibits the trigger pulses to triac 46 to interrupt the ac power flowing to the heating element 30.

In this manner the temperature may be selectively controlled from near ambient to the maximum temperature of thermoelectric heat pump 12 in the heat or cool mode by manipulating the temperature selection dial of the potentiometer. Temperature control is attainable to within ±0.5° C.

It will be appreciated by those skilled in the art that the above-described embodiment may be modified without departing from the scope of the invention.

We claim:

1. A thermoelectric power device comprising:
(a) a thermoelectric power generator means for generating means for generating dc power, said thermoelectric power generator means including a thermoelectric heat pump and a heating element means operatively connected to the thermoelectric heat pump for generating a dc power supply in response to the thermal energy emanating from the heater element, said heater element means including a heating element and a zero voltage control means operatively connected to the heating element for controlling the ac power applied thereto, said zero voltage control means having a zero voltage switch means and a bi-directional triode thyristor (triac), the triac having a trigger terminal connected to the zero voltage switch means for controlling the ac power supplied to the heater element; and
(b) a thermoelectric heat pump operatively connected to the thermoelectric power generator means for producing, selectively, heating and cooling characteristics in response to the dc power generated by the thermoelectric power generator.

2. A thermoelectric power generating device according to claim 1, wherein the zero voltage control means further includes a potentiomenter operatively connected to the zero voltage switch output to the trigger terminal of the triac.

3. A thermoelectric power generating device according to claim 2 further including a thermally sensitive resistor (thermistor) operatively connected to the potentiometer and zero voltage switch means whereby when the resistances of the thermistor and potentiometer are substantially equal the zero voltage control switch inhibits the trigger pulses to the triac to cut-off ac power applied to the heating element.

4. A thermoelectric power generating device comprising:
(a) a connector means for connecting to a source of ac power;
(b) a heating element operatively connected to the connector means for the source of ac power;
(c) a triac operatively connected to the heating element, said triac having a trigger terminal;
(d) a zero voltage switch operatively connected to the trigger terminal of the silicon controlled rectifier;
(e) a potentiometer operatively connected to the zero voltage switch for providing a resistance representative of a preselected temperature;
(f) a thermally sensitive resistor (thermistor) operatively connected to the zero voltage switch and potentiometer;
(g) a first thermoelectric heat pump in juxtaposition with the heater element and operative in response to heat emanating from the heater element for producing a dc voltage; and
(h) a second thermoelectric heat pump operably connected to the first thermoelectric heat pump for producing, selectively, heating and cooling characteristics in response to the dc voltage of the first thermoelectric heat pump, said second thermoelectric heat pump in juxtaposition to the thermally sensitive resistor (thermistor) whereby the resistance of the thermistor varies in relationship to the temperature of the working plate of the first thermoelectric heat pump; and whereby when the resistance of the thermistor substantially equals the resistance of the potentiometer the zero voltage switch inhibits the trigger pulses to the triac to cut-off ac power to the heating element.

5. A thermoelectric power generating device comprising a transformerless means for converting ac to dc, said transformerless means including a heater element having terminals for connection to an ac power source for producing thermal energy and a first thermoelectric heat pump having first and second spaced plates, said first plate in operative association with the heater element for producing a temperature differential across the first and second plates whereby the thermoelectric heat pump produces dc power.

6. A thermoelectric power generating device according to claim 5 further including a second thermoelectric heat pump having first and second plates operatively connected, selectively, to the dc power producing thermoelectric heat pump for generating, selectively, heating and cooling plates in response to the dc.

7. A thermoelectric power generating device according to claim 6 further including a temperature sensor means operatively connected to the source of power and in operative association with the second thermoelectric heat pump for controlling the ac power flowing to the heater element in response to the temperature of the second thermoelectric heat pump.

* * * * *